(12) United States Patent
Lewis et al.

(10) Patent No.: US 8,654,578 B2
(45) Date of Patent: Feb. 18, 2014

(54) PHASE QUBIT CELL HAVING ENHANCED COHERENCE

(75) Inventors: Rupert M. Lewis, Laurel, MD (US); Ofer Naaman, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 271 days.

(21) Appl. No.: 13/162,683

(22) Filed: Jun. 17, 2011

(65) Prior Publication Data

US 2012/0320668 A1 Dec. 20, 2012

(51) Int. Cl.
*G11C 11/34* (2006.01)

(52) U.S. Cl.
USPC .......... 365/162; 257/30; 257/31; 257/34; 326/3; 327/366; 327/367; 327/528

(58) Field of Classification Search
USPC ............ 365/162; 257/30, 31, 34; 326/3; 327/366, 367, 528
See application file for complete search history.

(56) References Cited

U.S. PATENT DOCUMENTS

| | | | |
|---|---|---|---|
| 6,979,836 B2 | 12/2005 | Zagoskin et al. | |
| 7,135,701 B2 | 11/2006 | Amin et al. | |
| 7,253,654 B2 | 8/2007 | Amin | |
| 7,335,909 B2 | 2/2008 | Amin et al. | |
| 2004/0012407 A1 | 1/2004 | Amin et al. | |
| 2005/0001209 A1* | 1/2005 | Hilton et al. | 257/20 |
| 2005/0101489 A1 | 5/2005 | Blais et al. | |
| 2007/0047743 A1 | 3/2007 | Taenzer et al. | |
| 2009/0014714 A1 | 1/2009 | Koch | |
| 2009/0015317 A1 | 1/2009 | DiVincenzo et al. | |
| 2010/0182039 A1* | 7/2010 | Baumgardner et al. | 326/7 |

OTHER PUBLICATIONS

International Search Report for corres. PCT/US12/42645, completed Aug. 27, 2012.
Ithier, et al.; "*Decoherence of a Quantum Bit Circuit*"; Seminair Poincare 1 (2005) 95-113.
Martinis, et al.; "*Decoherence of a Superconducting Qubit Due to Bias Noise*"; The American Physical Society, 2003; Physical Review B 67, 094510 (2003); 0163-1829/2003/67(9)/094510(10); pp. 094510-1-09451-10.

* cited by examiner

*Primary Examiner* — Toan Le
(74) *Attorney, Agent, or Firm* — Tarolli, Sundheim, Covell & Tummino LLP

(57) ABSTRACT

Methods and apparatuses are provided for storing a quantum bit. One apparatus includes a first phase qubit, a second phase qubit, and a common bias circuit configured to provide a first bias to the first phase qubit and a second bias to the second phase qubit, such that noise within the first bias is anti-correlated to noise within the second bias.

20 Claims, 3 Drawing Sheets

PHASE QUBIT CELL HAVING ENHANCED COHERENCE

TECHNICAL FIELD

The present invention relates generally to quantum computing systems, and more particularly to phase qubit assemblies having enhanced coherence.

BACKGROUND

A phase qubit can be a current-biased Josephson junction, operated in the zero voltage state with a non-zero current bias. A Josephson junction is a tunnel junction, made of two pieces of superconducting metal separated by a very thin insulating barrier, for example, about one nanometer in thickness. The insulating barrier is sufficiently thin to allow electrons, or in the superconducting state, Cooper-paired electrons, to tunnel through the barrier at an appreciable rate. Each of the superconductors that make up the Josephson junction can be described by a macroscopic wavefunction, as described by the Ginzburg-Landau theory for superconductors. The difference in the complex phases of the two superconducting wavefunctions is the most important dynamic variable for the Josephson junction, and is called the phase difference, or phase, of the Josephson junction.

SUMMARY

In accordance with one aspect of the invention, a qubit cell is provided for storing a quantum bit. The apparatus comprises a first phase qubit, a second phase qubit, and a common bias circuit configured to provide a first bias to the first phase qubit and a second bias to the second phase qubit, such that noise within the first bias is anti-correlated to noise within the second bias.

In accordance with another aspect of the invention, an apparatus is provided for storing a quantum bit. A first phase qubit is biased with a first bias as to produce a first bias current within the first phase qubit. A second phase qubit is coupled to the first qubit and biased with a second bias to produce a second bias current within the second phase qubit that is equal and opposite to the first bias current.

In accordance with a further aspect of the invention, a method is provided for storing a quantum bit in a plurality of coupled phase qubits. A common bias supply is provided to bias each of the plurality of coupled phase qubits, such that a first derivative of an energy of a first excited state of a system comprising the plurality of coupled phase qubits with respect to the common bias current is substantially equal to zero. The system is placed a state representing the quantum bit.

DETAILED DESCRIPTION

The present invention is directed to phase qubit assemblies having enhanced coherence and methods for storing quantum information within the phase qubit assemblies. The quantum state of a system can be represented by a complex number with phase and amplitude. The phase evolution of this quantum state can be represented as:

$$\phi(t) = h \int_0^t dt' f_{01}(t')$$ Eq. 1 where h is Planck's constant.

To represent noise within the system, we can represent the state $f_{01}$ as $f_{01}(I_b + I_n)$, where $I_b$ is an applied bias and $I_n$ is noise riding on the bias. Then the phase error, $\delta\phi$, after a time, t, can be expressed as:

$$\delta\varphi(t) = h \frac{df_{01}}{dI_b} \int_0^t dt' I_n(t')$$ Eq. 2

Further, $t_2$, a time scale of decoherence, is calculated from the mean square value of the phase fluctuations, i.e., $$t_2 \propto \langle (\delta\varphi(t))^2 \rangle \approx \left[ \frac{df_{01}}{dI_b} \right]^2.$$

Accordingly, it has been determined that minimizing the slope of the $f_{01}$ curve will provide a significant improvement in coherence times for phase qubits.

Figure 1:
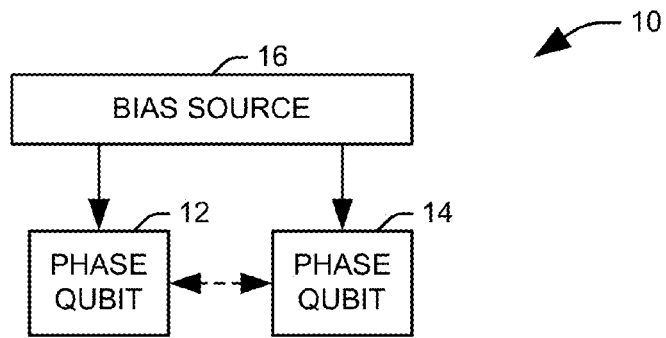
FIG. 1 illustrates a functional block diagram of an enhanced coherence phase qubit storage cell in accordance with an aspect of the present invention.

FIG. 1 illustrates a functional block diagram of an enhanced coherence phase qubit cell 10 in accordance with an aspect of the present invention. The assembly 10 comprises a plurality of phase qubits 12 and 14, each provided with respective biases from an associated bias source 16. For example, the provided biases can include a bias current provided to or induced within the phase qubits 12 and 14 or a flux provided to each phase qubits 12 and 14. In one implementation, each phase qubit 12 and 14 comprises a Josephson junction embedded in a superconducting loop and biased by a bias current provided within the phase qubit via an appropriate electrical connection. The loop can also comprise any circuit elements necessary to operatively connect the phase qubit to an associated read circuit. The bias currents can be provided to the phase qubits 12 and 14 in any appropriate manner, including directly providing the current to the Josephson junction or inducing a circulating current within the loop. It will be appreciated, however, that other implementations of the phase qubits 12 and 14 are possible within the spirit of the present invention, and that these implementations can be biased in a different manner.

In accordance with an aspect of the present invention, the first and second qubits 12 and 14 can be coupled, such that energy can pass between the first qubit 12 and the second qubit 14. It will be appreciated that the term "coupled" is intended to encompass not only a means of physical coupling, such as a mechanical coupling by means of an electrical conductor, but also any other appropriate coupling means including capacitive, inductive, magnetic, nuclear, nanomechanical, and optical coupling, or any combination of the foregoing. In one example, the bias current or flux for the phase qubits 12 and 14 are provided such that the noise experienced by the qubits is anti-correlated. In other words, a given change in the bias experienced by one qubit is mirrored by an equal and opposite change in the bias provided to the other qubit. In one implementation, this can be accomplished by providing a common bias circuit that gives equal and opposite bias contributions to each of the two phase qubits 12 and 14.

Figure 2:
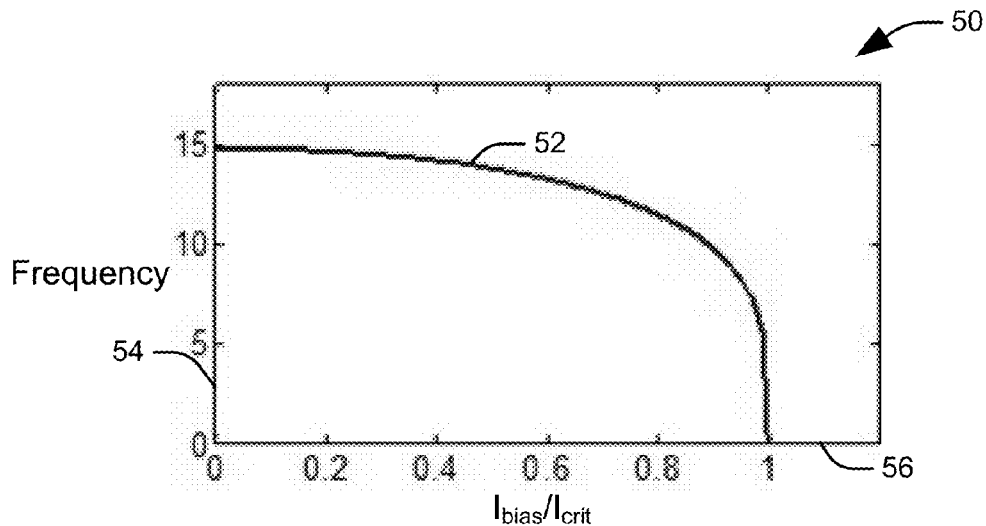
FIG. 2 illustrates a first excitation spectrum representing the excitation frequency for a transition of a single phase qubit from a ground state to a first excited state as a function of a bias current.

FIG. 2 illustrates a first excitation spectrum 50 representing the excitation frequency 52 for a transition of a single phase qubit from a ground state to a first excited state as a function of a bias current. In the illustrated excitation spectrum 50, it is assumed that the bias to the qubit is provided as a bias current. The vertical axis 54 represents frequency, in gigahertz, and the horizontal axis 56 represents a ratio of the bias current to a critical bias current of the qubit. It will be appreciated that the excitation frequency is relatively insensitive to the bias frequency until a significant amount of bias current has been applied, limiting the useable spectrum of the phase qubit to about thirty percent of its tunable range. Further, the useable spectrum occurs in a region in which the sensitivity of the excitation frequency to fluctuations in the bias current is significant, such that even small amounts of noise in the bias current could induce phase errors in the quantum information stored in the qubit.

Figure 3:
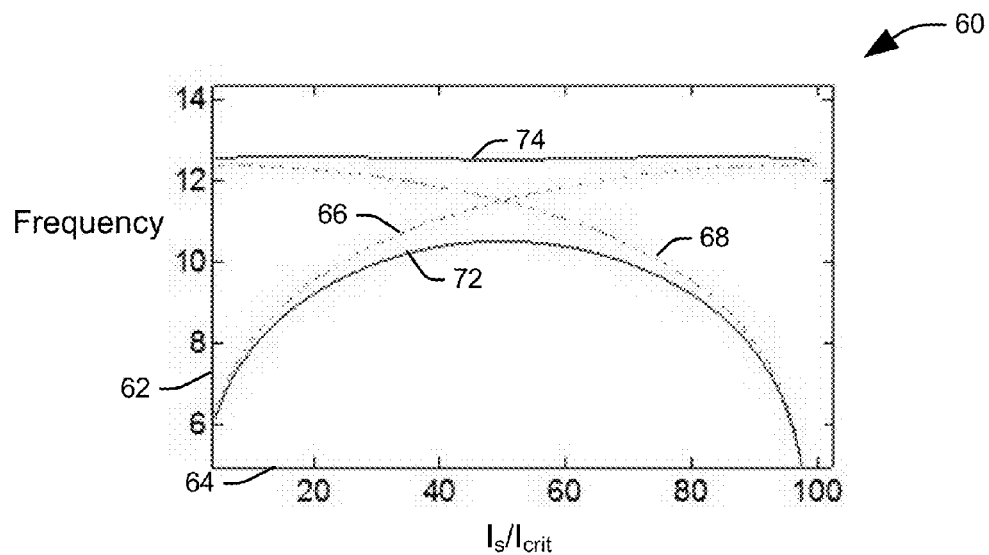
FIG. 3 illustrates a second excitation spectrum representing excitation frequencies for a system comprising coupled first and second phase qubits.

FIG. 3 illustrates a second excitation spectrum 60 representing excitation frequencies for a system comprising coupled first and second phase qubits. In the illustrated excitation spectrum 60, it is assumed that the bias to the first and second phase qubits is provided as a bias current, although other methods (e.g., a flux bias) for providing the bias are also available. The vertical axis 62 represents frequency, in gigahertz, and the horizontal axis 64 represents a ratio of a supply current, $I_s$, used to bias the two qubits to a critical bias current of the phase qubits. In the illustrated chart, it is assumed that a bias current is provided to each qubit as part of a "mirror biasing" arrangement, in which the qubits are biased via a common bias circuit using the supply current to provide equal and opposite bias current contributions to each qubit. Accordingly, the supply current represented by the horizontal axis 64 refers to a current through the common bias circuit, such that the bias current provided to the first qubit increases as the supply current through the common bias circuit increases, and the bias current provided to the second qubit decreases as the supply current through the common bias circuit increases.

The diagram includes a first plot of an excitation frequency 68 for a transition of the first phase qubit from a ground state to a first excited state and a second plot of an excitation frequency 66 for a transition of the second phase qubit from a ground state to a first excited state. It will be appreciated, however, that when the two qubits are coupled, the eigenmodes of the system are altered. When the excitation frequencies of the two qubits are commensurate, the eigenstates include a first excited state 72, represented as $|1\rangle = \alpha|e_1 g_2\rangle - \beta|g_1 e_2\rangle$, and a second excited state 74, represented as $|2\rangle = \alpha|e_1 g_2\rangle + \beta|g_1 e_2\rangle$, where $e_x$ represents an excited state of an $x^{th}$ qubit, $g_x$ represents a ground state of an $x^{th}$ qubit, and $\alpha$ and $\beta$ are state amplitudes.

In accordance with an aspect of the present invention, the supply current to the common bias circuit can be selected to minimize the effects of noise within the bias currents provided to the qubits. Specifically, the supply current can be selected such that the derivative of the transition energy ($f_{01}$) of the coupled system with respect to the supply current ($I_s$) is substantially equal to zero. It will be appreciated that both the transition frequencies for both energy states 72 and 74 exhibit local extrema at resonance, that is, where the energy of the two qubits is substantially equal, such that $$\frac{d f_{01}}{d I_s}$$

is substantially equal to zero. This significantly reduces the response of the coupled system to noise within the bias line.

The energy, $E_C$, of the coupled states can be expressed as:

$$E_C = \frac{E_1 + E_2}{2} \pm \frac{\sqrt{(E_1 - E_2)^2 + 4g^2}}{2} \qquad \text{Eq. 3}$$

where $E_1$ is the transition energy of the first qubit, $E_2$ is the transition energy of the second qubit, and $g$ is the energy of the coupling between the two qubits.

At resonance, the transition energies of the two qubits are approximately equal, such that, when the energy of the coupling is greater than the difference in the qubit energies, the energy of each qubit can be expressed as a common energy $E$, with a small fluctuation, $\delta$, due to noise in the bias current. Letting $E_1 = E + \delta$ and $E_2 = E - \delta$, Equation 3 can be rewritten as:

$$E_C = \bar{E} \pm g\sqrt{1 + \frac{4\delta^2}{4g^2}} \approx (\bar{E} \pm g) \pm \frac{\delta^2}{2g} \qquad \text{Eq. 4}$$

where $\bar{E}$ is the average of the energies of the qubits.

Accordingly, when the qubits are biased in resonance with one another, small fluctuations in the energy of the coupled system are reduced by approximately the strength of the coupling energy between the two qubits, allowing for enhanced rejection of noise in the biasing circuits. This occurs because the noise from the bias line seen by each qubit is anti-correlated. The lifetime, $T_1$, of the coupled system, representing the energy decay time of the qubit, can be calculated in a manner similar to that used above in Equations 3 and 4, letting $E_i \rightarrow E_i + j\gamma_i$, where $j\gamma_i$ are the respective lifetimes of the individual qubits. From this, it can be determined that the lifetime of the coupled system on resonance is the average of the lifetimes of the individual qubits [i.e., $(\gamma_1 + \gamma_2)/2$]. As the individual qubits are tuned away from resonance, the lifetime of the coupled system interpolates smoothly between the two with a weighting reflecting the approximate fraction of the coupled state in each qubit.

Figure 4:
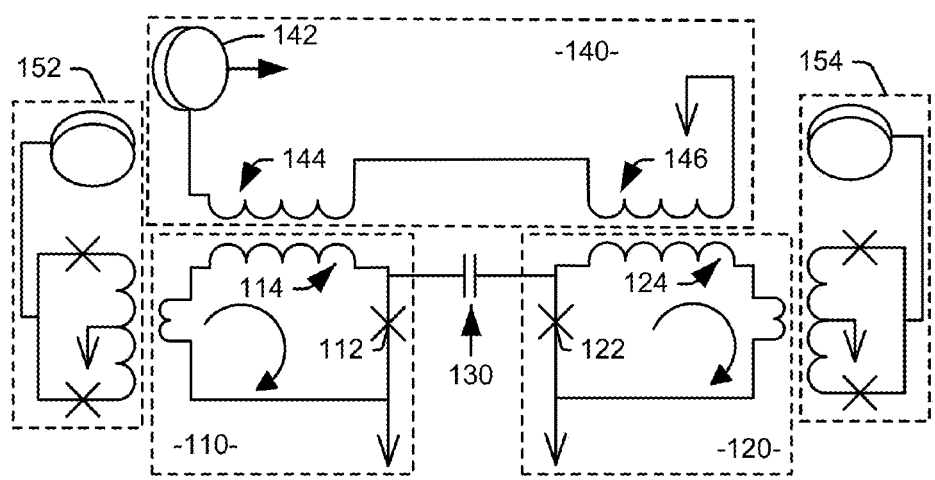
FIG. 4 illustrates one example of a circuit for storing a quantum bit in accordance with an aspect of the present invention.

FIG. 4 illustrates one example of a quantum circuit 100 for storing a quantum bit in accordance with an aspect of the present invention. The circuit 100 comprises a first phase qubit 110 and a second phase qubit 120, coupled by a coupling element 130. In the illustrated circuit, the coupling element 130 is implemented as a capacitor, but it will be appreciated that the two phase qubits could be coupled by any appropriate means. For example, the two qubits 110 and 120 could be inductively coupled, with the coupling element 130 comprising one or more circuit elements having significant inductance.

Each phase qubit 110 and 120 comprises a Josephson junction 112 and 122 implemented within a superconducting loop. In the illustrated circuit, each phase qubit 110 and 120 further comprises an inductor 114 and 124 in series with the Josephson junction 112 and 122 and configured to receive a bias current for its associated Josephson junction from an associated bias circuit 140. The circuit 100 further comprises respective first and second read circuits 152 and 154, each configured to detect an associated state of its corresponding phase qubit 110 and 120. In the illustrated implementation, each read current 152 and 154 measures shifts in the current circulating in the superconducting loop comprising each qubit 110 and 120 via a SQUID magnetometer. It will be appreciated, however, that the state of the qubit can be read out using any existing technology such as measuring a reflection of microwaves or optical signals from the qubit.

In the illustrated implementation, the bias circuit 140 includes a current source 142 and first and second inductors 144 and 146 to provide a supply current to the inductors 114 and 124 associated with the first and second qubits 110 and 120, such that the bias current provided to the first and second qubits can be controlled by varying the current provided by the current source. For example, the inductors 114, 124, 144, and 146 can be configured such that the flux induced in the first qubit 110 can have a polarity, relative to the Josephson junction 112, that is opposite to a polarity of the flux induced in the second qubit 120 relative to its Josephson junction 122. Accordingly, an increase in the current supplied by the current source 142 will increase the bias current provided to the first qubit 110 and decrease the bias current provided to the second qubit 120. Since the state of the system is a function of the combined energy and the noise experienced by the two qubits 110 and 120 are anti-correlated, small fluctuations in the current supplied by the current source 142 are effectively cancelled out in the illustrated arrangement, minimizing their effect on the energy of the system.

Figure 5:
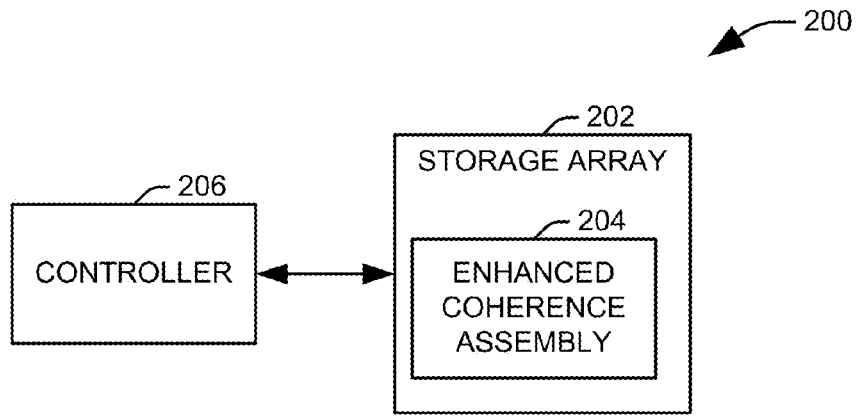
FIG. 5 illustrates a quantum system configured to store and read a plurality of quantum bits in accordance with an aspect of the present invention.

FIG. 5 illustrates a quantum system 200 configured to store and process a plurality of quantum bits in accordance with an aspect of the present invention. The memory 200 can comprise a storage array 202 including a plurality of individually addressable qubit cells, with each cell configured to store a quantum bit of information. In the illustrated implementation, the plurality of individually addressable qubit cells within the storage array 202 includes at least one enhanced coherence coupled phase qubit assembly 204 implemented in accordance with the present invention. Specifically, the enhanced coherence phase qubit assembly 204 can comprise an assembly similar to that illustrated in FIG. 1.

The storage array 202 can be operatively connected to a controller 206 configured to store, retrieve, and perform gate operations on data within the storage array. For example, the controller 206 can be configured to tune individual qubits associated with the individually addressable qubit cells, via respective classical control mechanisms, along their respective frequency ranges. Alternatively, the controller 206 can provide current or voltage along one or more read and write lines associated with the array to store quantum information in a given qubit cell or read information from the cell. The controller 206 can also monitor the location of quantum information within the storage array 202. In one implementation, the controller 206 is implemented, at least in part, as a classical computer system comprising a processor and stored executable instructions for performing read and store operations on the storage array 202.

Figure 6:
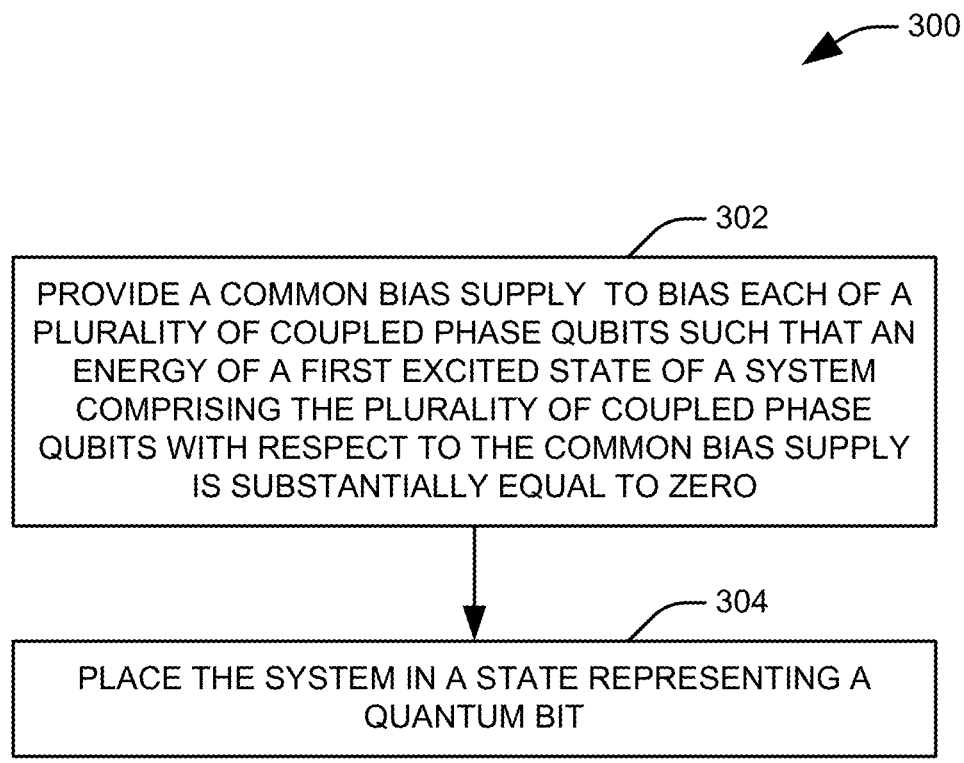
FIG. 6 illustrates a method for storing a quantum bit in a plurality of coupled phase qubits in accordance with an aspect of the present invention.

FIG. 6 illustrates a method 300 for storing a quantum bit in a plurality of coupled phase qubits in accordance with an aspect of the present invention. At 302, a common supply current is provided to bias each of the plurality of coupled phase qubits. The plurality of coupled qubits represent a system, having combined energy states produced by the coupling between the qubits. The common supply current is selected such that a first derivative of an energy of a first excited state of this system with respect to the common supply current is substantially equal to zero. By biasing the system in this manner, the sensitivity of the coupled system to noise within the supply current can be significantly reduced. It will be appreciated that the plurality of phase qubits can be biased by any appropriate means. In one implementation, the common supply current is provided to a common bias circuit comprising a plurality of inductors. Each inductor can be paired with an inductor in an associated one of the plurality of coupled phase qubits, so as to induce a bias current within its associated phase qubit.

In one example, the common supply current can be provided as to bias a first phase qubit with a first bias current and a second phase qubit with a second bias current equal and opposite to the first phase qubit. For example, where the common bias circuit described above is used, the inductors can be arranged to induce currents in each qubit having opposite directions. One advantage of this arrangement is allowing the noise within the first bias current to be anti-correlated to noise within the second bias current. It will be appreciated, however, that other methods for providing anti-correlated bias noise to a pair of qubits can be used within the spirit of the invention. At 304, the system is placed in a state representing the quantum bit. For example, energy can be provided to the system to place the system in a specific energy state or superposition of energy states, via a microwave pulse or other appropriate means.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A qubit cell comprising:
   a first phase qubit;
   a second phase qubit; and
   a common bias circuit, comprising a single bias source that is configured to provide a first bias to the first phase qubit and a second bias to the second phase qubit, such that noise within the first bias is anti-correlated to noise within the second bias.

2. The qubit cell of claim 1, the common bias circuit being configured such that the first bias is equal and opposite to the second bias.

3. The qubit cell of claim 1, wherein the first phase qubit is coupled to the second phase qubit.

4. The qubit cell of claim 3, wherein the first phase qubit is capacitively coupled to the second phase qubit.

5. The qubit cell of claim 3, wherein the first phase qubit is inductively coupled to the second phase qubit.

6. The qubit cell of claim 1, the common bias circuit comprising a current source configured to provide a bias supply, each the first and second biases being derived from the bias supply.

7. The qubit cell of claim 6, the bias supply being selected such that a first derivative of an energy of a first excited state of a system comprising the first and second phase qubits with respect to the bias current is substantially equal to zero.

8. The qubit cell of claim 1, the first phase qubit comprising a Josephson junction embedded in a superconducting loop.

9. The qubit cell of claim 1, the common bias circuit comprising:

a first inductor coupled to the first qubit;
a second inductor coupled to the second qubit; and
a current source configured to provide a supply current to each of the first and second inductors as to induce a first bias current in the first phase qubit and a second bias current in the second phase qubit.

10. A quantum system comprising:
a storage array comprising the qubit cell of claim 1; and
a controller configured to store and retrieve data within the storage array.

11. An apparatus for storing a quantum bit comprising:
a first phase qubit, the first phase qubit being biased with a first bias as to produce a first bias current within the first phase qubit; and
a second phase qubit coupled to the first phase qubit, the second phase qubit being biased with a second bias to produce a second bias current within the second phase qubit having a magnitude that is equal to a magnitude of the first bias circuit and a polarity that is opposite to a polarity of the first bias current.

12. The apparatus of claim 11, further comprising a common bias circuit configured to provide the first and second biases.

13. The apparatus of claim 12, the common bias circuit comprising:
a first inductor coupled to the first qubit;
a second inductor coupled to the second qubit; and
a current source configured to provide a supply current to each of the first and second inductors as to induce the first bias current in the first phase qubit and the second bias current in the second phase qubit.

14. The apparatus of claim 13, the current source being configured to provide a supply current being selected such that a first derivative of an energy of a first excited state of a system comprising the first and second phase qubits with respect to the bias current is substantially equal to zero.

15. The apparatus of claim 11, the first phase qubit comprising a first Josephson junction embedded in a first superconducting loop and the second phase qubit comprising a second Josephson junction embedded in a second superconducting loop.

16. The apparatus of claim 15, each of the first bias current and the second bias current being provided such that a polarity of the first bias current relative to the first Josephson junction is opposite to a polarity of the second bias current relative to the second Josephson junction.

17. A method for storing a quantum bit in a plurality of coupled phase qubits comprising:
providing a common bias supply to bias each of the plurality of coupled phase qubits, such that a first derivative of an energy of a first excited state of a system comprising the plurality of coupled phase qubits with respect to the common bias current is substantially equal to zero; and
placing the system in a state representing the quantum bit.

18. The method of claim 17, wherein providing the common bias supply to bias each of the plurality of coupled phase qubits comprises biasing a first phase qubit with a first bias current and biasing a second phase qubit with a second bias current having a polarity equal and opposite in polarity to the first bias current.

19. The method of claim 17, wherein providing the common bias supply to bias each of the plurality of coupled phase qubits comprises biasing a first phase qubit with a first bias and biasing a second phase qubit with a second bias such that noise within the first bias is anti-correlated to noise within the second bias.

20. The method of claim 17, wherein providing the common supply bias current to bias each of the plurality of coupled phase qubits comprises providing the common bias supply to a common bias circuit comprising a plurality of inductors, each inductor being associated with one of the plurality of coupled phase qubits and configured to induce a bias current within its associated phase qubit.

* * * * *